(12) United States Patent
Shibata et al.

(10) Patent No.: US 7,517,771 B2
(45) Date of Patent: Apr. 14, 2009

(54) METHOD FOR MANUFACTURING SEMICONDUCTOR DEVICE HAVING TRENCH

(75) Inventors: Takumi Shibata, Tajimi (JP); Shoichi Yamauchi, Nagoya (JP); Hitoshi Yamaguchi, Nisshin (JP); Masaru Hori, Nisshin (JP)

(73) Assignee: DENSO CORPORATION, Kariya (JP)

( * ) Notice: Subject to any disclaimer, the term of this patent is extended or adjusted under 35 U.S.C. 154(b) by 162 days.

(21) Appl. No.: 11/496,708

(22) Filed: Aug. 1, 2006

(65) Prior Publication Data

US 2007/0032092 A1    Feb. 8, 2007

(30) Foreign Application Priority Data

Aug. 2, 2005  (JP) ............................. 2005-224629

(51) Int. Cl.
*H01L 21/76* (2006.01)
(52) U.S. Cl. ............................. 438/429; 257/E21.461; 438/360; 438/758
(58) Field of Classification Search ................. 438/429, 438/700, 758, 360; 257/E21.461
See application file for complete search history.

(56) References Cited

U.S. PATENT DOCUMENTS

| 6,097,063 | A |   | 8/2000 | Fujihira |
|---|---|---|---|---|
| 6,107,197 | A | * | 8/2000 | Suzuki .................. 438/677 |
| 6,294,818 | B1 |   | 9/2001 | Fujihira |
| 6,566,709 | B2 |   | 5/2003 | Fujihira |
| 6,627,948 | B1 |   | 9/2003 | Fujihira |
| 6,700,157 | B2 |   | 3/2004 | Fujihira |
| 6,720,615 | B2 |   | 4/2004 | Fujihira |
| 6,724,040 | B2 |   | 4/2004 | Fujihira |
| 6,734,496 | B2 |   | 5/2004 | Fujihira |
| 7,029,977 | B2 |   | 4/2006 | Kishimoto et al. |
| 2002/0125208 | A1 | * | 9/2002 | Christenson et al. ........... 216/2 |
| 2003/0071321 | A1 | * | 4/2003 | Hong ......................... 257/499 |
| 2004/0166612 | A1 | * | 8/2004 | Maydan et al. ............. 438/149 |
| 2005/0023624 | A1 | * | 2/2005 | Ahn et al. ................... 257/410 |
| 2005/0045984 | A1 | * | 3/2005 | Lin ............................. 257/510 |
| 2006/0216876 | A1 | * | 9/2006 | Kim et al. ................... 438/149 |

* cited by examiner

*Primary Examiner*—Asok K Sarkar
(74) *Attorney, Agent, or Firm*—Posz Law Group, PLC (57) ABSTRACT

A method for manufacturing a semiconductor device includes steps of: forming a trench on a semiconductor substrate, which is made of silicon; and filling the trench with an epitaxial layer. The epitaxial layer is made of silicon, and the step of filling the trench includes a step of performing a plasma CVD method with using a silicon source gas. By using anisotropic character of a plasma, the epitaxial layer is selectively deposited on a bottom of the trench. Thus, the trench is filled with the epitaxial layer having no void.

21 Claims, 7 Drawing Sheets

METHOD FOR MANUFACTURING SEMICONDUCTOR DEVICE HAVING TRENCH

CROSS REFERENCE TO RELATED APPLICATION

This application is based on Japanese Patent Application No. 2005-224629 filed on Aug. 2, 2005, the disclosure of which is incorporated herein by reference.

FIELD OF THE INVENTION

The present invention relates to a method for manufacturing a semiconductor device having a trench.

BACKGROUND OF THE INVENTION

As a semiconductor device manufactured in a way that a trench is formed in a semiconductor substrate including silicon (Si), and then the relevant trench is filled, a semiconductor device having a PN column layer is disclosed, for example, in JP-A-9-266311.

Figure 7:
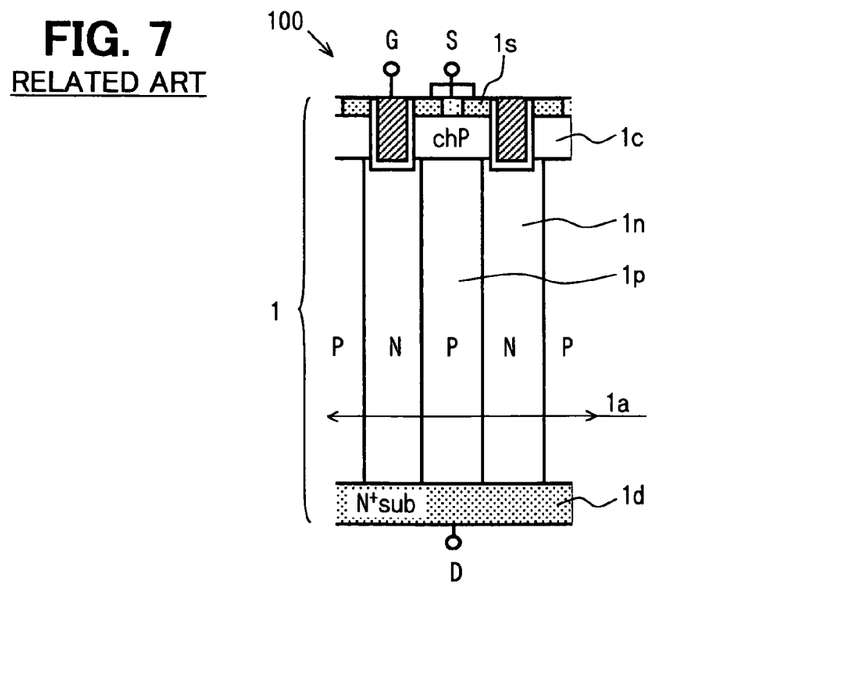
FIG. 7 is a cross sectional view showing a semiconductor device having a SJ construction according to a related art.

FIG. 7 is a schematic section view of a semiconductor device 100, showing a representative example of a semiconductor device having the same PN column layer as a related art.

The semiconductor device 100 shown in FIG. 7 is an N-channel vertical MOS transistor having a PN column layer 1$a$, which is formed in a middle portion along a section of a semiconductor substrate 1, and is rectangle in the section of the substrate, and has P-type conduction regions 1$p$ and N-type conduction regions 1$n$ in a striped repetitive pattern. The PN column layer 1$a$ acts as a drift layer of the vertical MOS transistor, and configures a super junction (SJ) structure.

In an on-state of the vertical MOS transistor formed in the semiconductor device 100, an electron flown out from a source region 1$s$ is flown into an N-type conduction region 1$n$ of the PN column layer 1$a$ through a channel formed in a P-type conduction layer 1$c$ in the periphery of a trench gate G, and reaches to a drain region 1$d$. Therefore, impurity concentration is increased in the N-type conduction region as a drift region 1$n$ of the PN column layer 1$a$, thereby on-resistance of the vertical MOS transistor formed in the semiconductor device 100 can be decreased. On the other hand, in an off-state, the PN column layer 1$a$ acting as the SJ structure can be perfectly depleted to have high breakdown voltage, i.e., high withstanding voltage. In the same way, conduction types of all components of the N-channel vertical MOS transistor shown in FIG. 7 are reversed, thereby a P-channel vertical MOS transistor having the SJ structure is obtained. The semiconductor device 100 having low on-resistance and high breakdown voltage is structurally featured in having the PN column layer 1$a$ in which the P-type conduction regions 1$p$ and the N-type conduction regions 1$n$ are in the repetitive pattern.

A formation method of the PN column layer 1$a$ as a feature of the semiconductor device 100 is disclosed, for example, in JP-A-2004-273742, which corresponds to U.S. Pat. No. 7,029,977.

According to the method, a trench is formed in a surface portion of a semiconductor substrate in a first conduction type, then a semiconductor in a second conduction type is epitaxially grown in the trench to fill it by low-pressure chemical vapor deposition (LP-CVD), thereby the PN column layer 1$a$ is formed. In such a formation method of the PN column layer using trench formation and subsequent filling, impurity concentration distribution can be made uniform in a depth direction in the trench (thus, thickness direction of the PN column layer 1$a$) unlike a formation method of the PN column layer using impurity diffusion.

To increase breakdown voltage of the vertical MOS transistor formed in the semiconductor device 100 shown in FIG. 7, the PN column layer 1$a$ as the drift layer needs to be formed thick. For example, to obtain breakdown voltage of 600 V, the PN column layer 1$a$ needs to have thickness equal to or more than 30 μm. Furthermore, to allow the PN column layer 1$a$, which was formed with high impurity concentration for decreasing on-resistance, to be completely depleted, width of the PN column layer 1$a$ needs to be narrowed to about 1 μm. Therefore, when the PN column layer 1$a$ is formed according to the method, a trench having a large aspect ratio (a ratio between the depth of 30 μm and the width of 1 μm is equal to 30) and filling of the relevant trench are necessary for the semiconductor device 100, which has low on-resistance and high breakdown voltage.

On the other hand, when the semiconductor is epitaxially grown by LP-CVD to fill the trench having the large aspect ratio, the following difficulty is given.

Figure 8A:
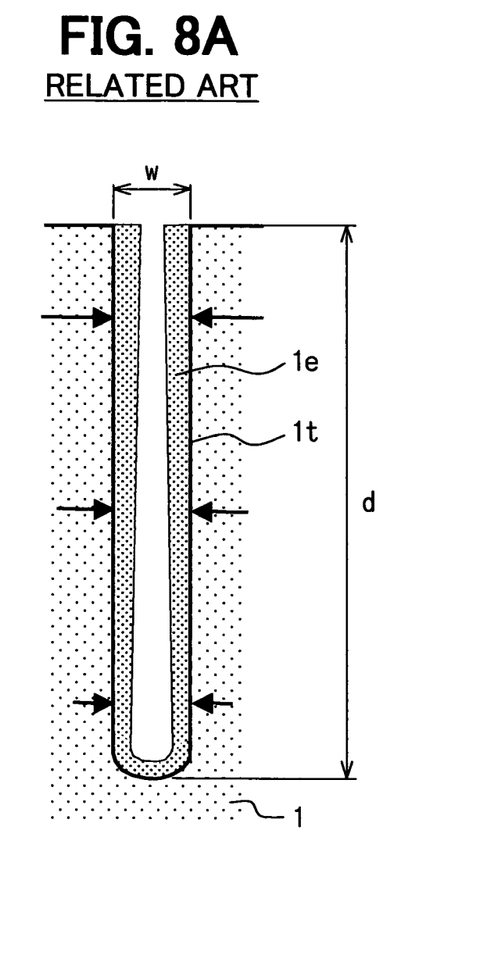
FIGS. 8A and 8B are cross sectional views explaining a step of filling a trench according to a related art.
Figure 8B:
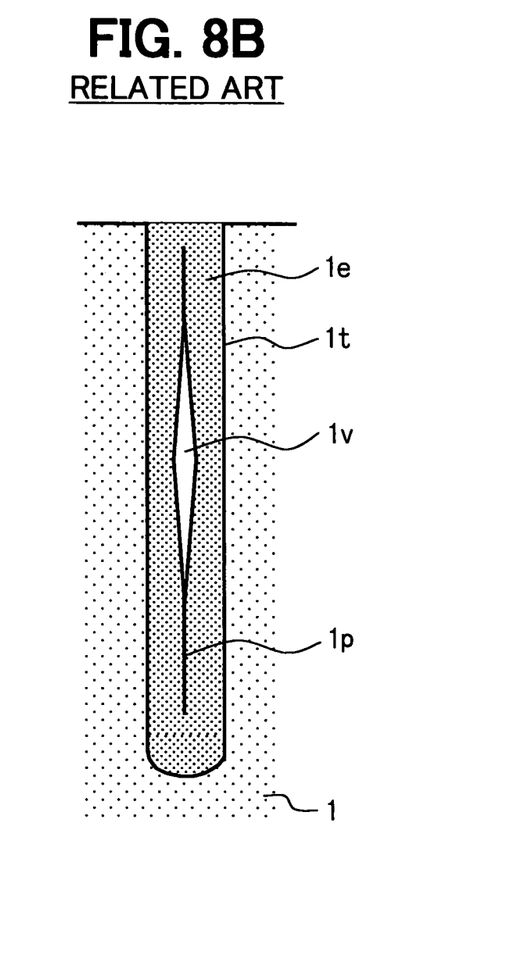

FIGS. 8A to 8B are enlarged section views of a trench 1$t$ formed in the semiconductor substrate 1, showing an aspect of the related art during trench-filling by epitaxial growth of the semiconductor using LP-CVD.

As shown in FIG. 8A, in the trench 1$t$ having a large aspect ratio (i.e., depth d/width w), a silicon (Si) source gas hardly reaches to a bottom of the trench 1$t$ during LP-CVD. Therefore, as shown by size of arrows in the drawing, a growth rate of an epitaxial layer 1$e$ is increased at an upper portion of the trench 1$t$. As a result, as shown in FIG. 8B, a top (i.e., an opening) of the trench 1$t$ is closed in an early stage, consequently a void 1$v$ that is imperfect filling tends to be formed within the trench 1$t$. Moreover, since an epitaxial layer 1$e$ is grown from sides of the trench 1$t$, thereby crystallinity of the epitaxial layer 1$e$ may be deteriorated in the periphery of the void 1$p$. In particular, when the aspect ratio of the trench 1$t$ is 30 or more, inferior crystals tend to be formed at the void 1$v$. When the inferior crystals are present in the periphery of the void 1$v$ as shown in FIG. 8B in the PN column layer 1$a$ in FIG. 7 formed by such trench-filling structure, they cause decrease in breakdown voltage of the semiconductor device 100 or inverse leakage current by defective connection.

Accordingly, as described before, as the aspect ratio of the trench is increased to obtain a semiconductor device 100 having lower on-resistance and higher breakdown voltage, trench-filling structure cannot be fabricated, leading to decrease in breakdown voltage of the semiconductor device 100 or inverse leakage current by defective connection due to the inferior crystals at the void 1$v$.

SUMMARY OF THE INVENTION

In view of the above-described problem, it is an object of the present disclosure to provide a method for manufacturing a semiconductor device having a trench.

According to an aspect of the present disclosure, a method for manufacturing a semiconductor device comprising steps of: forming a trench on a semiconductor substrate, which is made of silicon; and filling the trench with an epitaxial layer. The epitaxial layer is made of silicon, and the step of filling the trench includes a step of performing a plasma CVD method with using a silicon source gas.

By using an anisotropic characteristic of a plasma, the epitaxial layer is selectively deposited on a bottom of the trench. Accordingly, the trench is filled with the epitaxial layer having no void.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Embodiments of the present disclosure provide a manufacturing method of a semiconductor device, in which the device is manufactured in a way that a trench is formed in a semiconductor substrate including silicon (Si), and then the trench is filled by an epitaxial layer. For example, a trench is formed in a semiconductor substrate in the N conduction type or P conduction type, and then the trench is filled by an epitaxial layer having a conduction type different from that of the semiconductor substrate to form the PN column layer $1a$ shown in FIG. 7, consequently a semiconductor device 100 having the PN column layer $1a$ is manufactured.

Figure 1A:
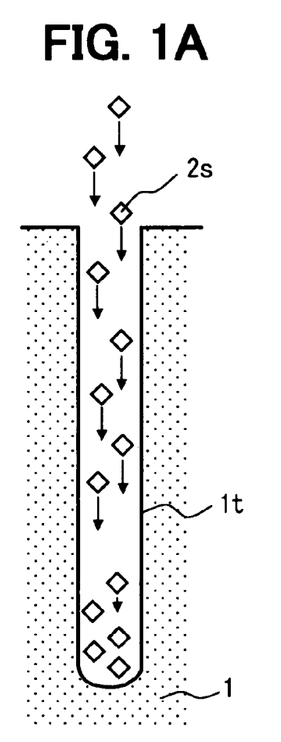
FIGS. 1A to 1C are cross sectional views explaining a step of filling a trench according to an embodiment.
Figure 1B:
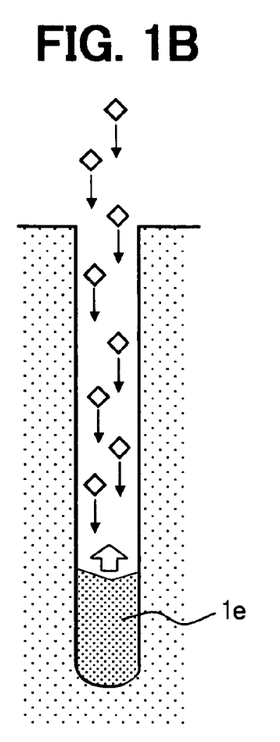
Figure 1C:
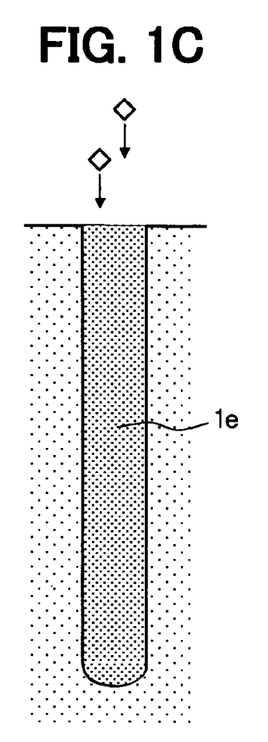

FIGS. 1A to 1C are cross section views of a trench $1t$ formed in a semiconductor substrate 1, schematically showing a filling process of the trench $1t$, which is provided to avoid the difficulty of the inferior crystal at the void $1v$ as described in FIG. 8B.

To avoid the difficulty of the inferior crystal at the void $1v$ in FIG. 8B, as shown in FIG. 1A, a silicon (Si) source $2s$ is preferentially allowed to reach to a bottom of the trench $1t$. Thus, as shown in FIG. 1B, a growth rate of an epitaxial layer $1e$ is made large at the bottom of the trench $1t$ compared with sides of the trench $1t$, so that as shown by an outline arrow, the epitaxial layer $1e$ including silicon (Si) is preferentially grown from the bottom of the trench $1t$. In this case, since a growth face of the epitaxial layer $1e$ is sequentially raised from the bottom of the trench $1t$ to a top (i.e., an opening) of the trench, as shown in FIG. 1C, the void is not formed in the epitaxial layer $1e$ for filling the trench lt.

To realize growth of the epitaxial layer $1e$ from the bottom of the trench $1t$ as shown in FIGS. 1A to 1C, the epitaxial layer $1e$ is grown by plasma CVD using the silicon (Si) source gas to fill the trench $1t$.

Plasma has been used for anisotropic etching of a silicon substrate, or deposition of an amorphous film having excellent coverage performance at low temperature. The epitaxial layer $1e$ is grown using plasma CVD to fill the trench $1t$ as seen in FIGS. 1A to 1C. Unlike the trench-filling using low-pressure CVD (LP-CVD) as in FIGS. 8A to 8B in the related art, in trench-filling using the plasma CVD, the following various kinds of deposition control can be performed, and therefore the epitaxial layer $1e$ can be selectively grown from the bottom of the trench by using anisotropy of plasma. Accordingly, trench-filling can be performed without formation of the void.

Figure 2A:
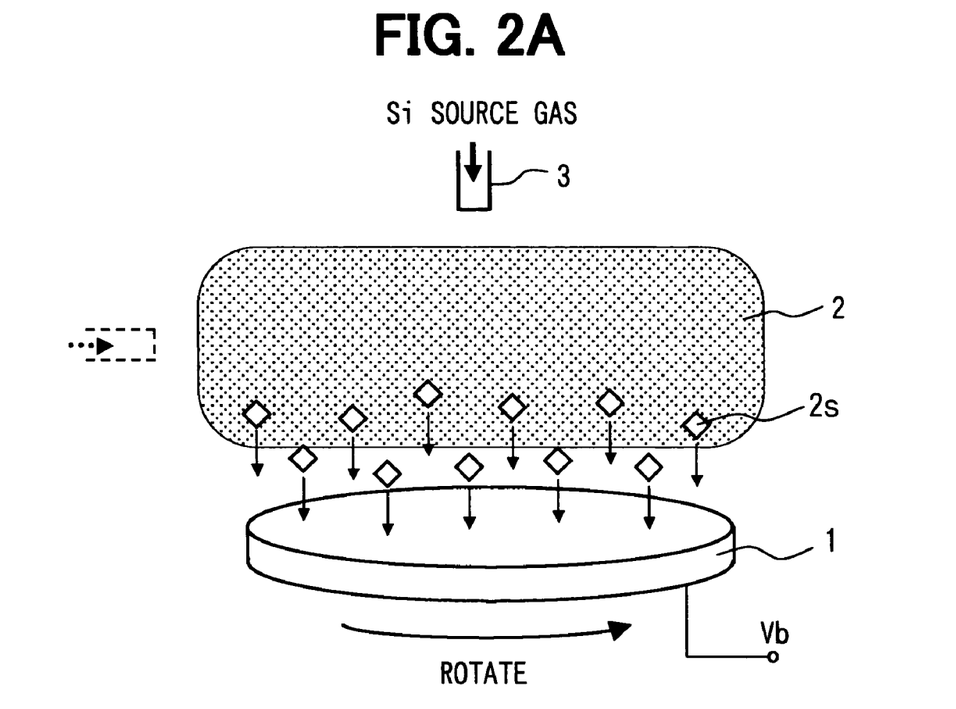
FIG. 2A is a schematic view explaining a plasma CVD method for growing an epitaxial layer on a bottom of the trench.
Figure 2B:
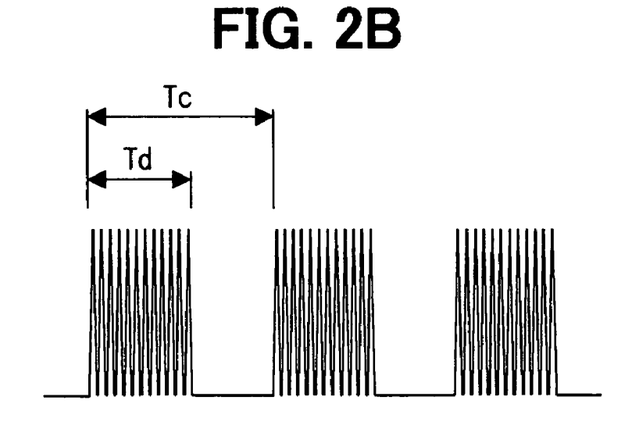
FIG. 2B is a graph showing a voltage waveform with high frequency used in the plasma CVD method.

FIGS. 2A to 2B are views for illustrating the plasma CVD used for growth of the epitaxial layer from the trench bottom, wherein FIG. 2A shows main components of the plasma CVD, and FIG. 2B shows a high-frequency voltage waveform used for plasma formation.

As shown in FIG. 2A, the plasma CVD is carried out in a way that a semiconductor substrate (wafer) 1 including silicon (Si) is set in a chamber, then a silicon (Si) source gas 3 such as a $SiH_4$ gas is supplied from a gas supply port into the chamber, and then high-frequency voltage of about 500 MHz as shown in FIG. 2B is applied and thus plasma 2 is formed. As the silicon source gas 3, for example, inexpensive silane ($SiH_4$) can be used. When the trench $1t$ is filled by the epitaxial layer $1e$ to form the PN column layer $1a$ in FIG. 7, an impurity gas having a conduction type different from that of the Si substrate 1 (P conduction type: $B_2H_6$ and the like, N conduction type: $PH_3$, $AsH_3$ and the like) is supplied into the chamber together with the Si source gas 3.

As shown in FIG. 2A, the Si source gas 3 is preferably supplied from an upside of the wafer 1. Thus, the Si source gas 3 can be supplied evenly in a plane of the wafer 1, therefore in-plane evenness of growth thickness (growth rate) or impurity concentration can be improved. On the other hand, when the Si source gas 3 is supplied in a lateral direction as shown by a dot line in FIG. 2A, in-plane distribution tends to occur in the growth thickness and the like.

The Si source gas 3 supplied from the gas supply port into the chamber is excited by the plasma 2, thereby each radical of $SiH_3$, $SiH_2$, SiH or Si, or each ion such as $SiH_3^+$ is formed, which is silicon (Si) source $2s$ of epitaxial growth.

According to a preliminary examination, among the respective radicals of $SiH_3$, $SiH_2$, SiH and Si excited from the Si source gas 3 by the plasma 2, the radical of $SiH_3$ most contributes to growth of the epitaxial layer including Si. Thus, among the respective radicals of $SiH_3$, $SiH_2$, SiH and Si, the radical amount of $SiH_3$ is maximized, thereby an epitaxial layer having excellent film quality can be grown at high growth rate.

Furthermore, according to another preliminary examination, among respective ions formed from the Si source gas 3 by the plasma 2, the ion of $SiH_3^+$ most contributes to separation of hydrogen (H) terminating a surface of the trench. Thus, among the respective ions formed by the plasma 2, the ion amount of $SiH_3^+$ is maximized, thereby H terminating the trench surface can be efficiently separated.

As described later, the separation of H by the $SiH_3^+$ ion is preferably combined with supply of Si by the $SiH_3$ radical to a site where H was separated, thereby the epitaxial layer having excellent film quality can be grown at high growth rate.

Since the plasma 2 has charge, when deposition is performed while the wafer 1 is grounded, or while bias voltage Vb is applied, the plasma 2 or each ion formed by the plasma 2 is attracted to a wafer 1 side, consequently anisotropic epitaxial growth can be performed.

The plasma formation voltage shown in FIG. 2B is high-frequency pulse voltage. Thus, the following control can be performed, which cannot be performed in the case of forming the plasma 2 by a continuous high-frequency wave. First, by using difference between an on-state and off-state of a high-frequency pulse, the ion and the radical can be alternately supplied into the trench. Second, by using a fact that lives of the radicals of $SiH_3$, $SiH_2$, SiH and Si excited by the plasma 2 are different from each together, a duty ratio (on-time Td/cycle time Tc) between on and off of the high-frequency pulse shown in FIG. 2B is appropriately set in accordance with a life of a required radical. Thus, the amount of the radical of $SiH_3$ can be maximized. At that time, the ion amount of $SiH_3^+$ is maximized at the same time.

A condition of maximizing the radical amount of $SiH_3$ and the ion amount of $SiH_3^+$ can be previously examined, and deposition can be carried out at an obtained, fixed condition during deposition by the plasma CVD. However, the radical amount of each radical of $SiH_3$, $SiH_2$, SiH or Si excited by the plasma 2, or the ion amount of each ion formed from the Si source gas 3 by the plasma 2 is preferably monitored during the deposition by the plasma CVD. Thus, even if the radical amount of each radical or the ion amount of each ion is varied during deposition, it can be monitored and used for feedback control to the optimum deposition condition.

Figure 3A:
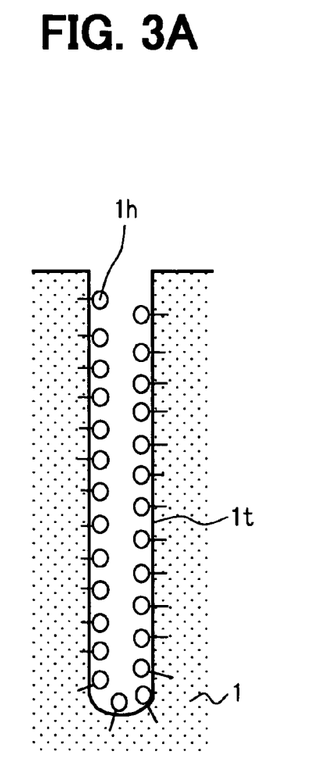
FIGS. 3A to 3C are cross sectional views explaining the step of filling the trench by using the plasma CVD method.
Figure 3B:
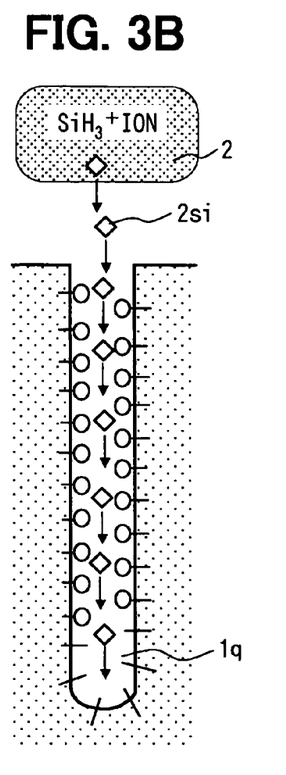
Figure 3C:
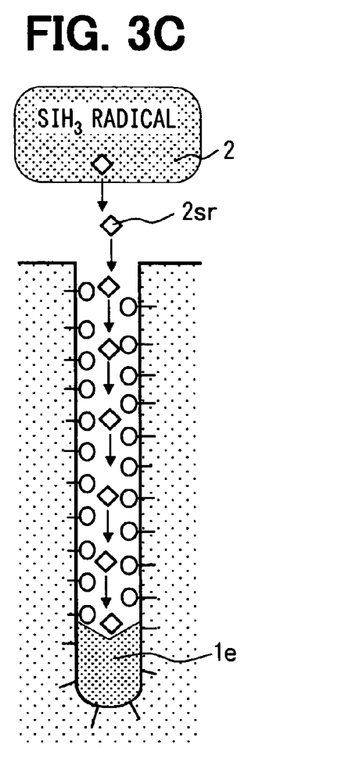

FIGS. 3A to 3C are views schematically showing a most preferable filling process of the trench 1t by the plasma CVD.

First, as shown in FIG. 3A, a surface of the trench 1t in the Si substrate (wafer) 1 is subjected to fluorinated acid (HF) treatment before starting the plasma CVD, so that Si in the surface of the trench 1t is previously terminated by hydrogen (H) 1h. Thus, the surface of the trench 1t is in a uniform and stable surface condition, thereby the following separation effect of H by the $SiH_3^+$ ion can be stably exhibited.

Next, the Si wafer 1 after HF treatment is set in a plasma CVD chamber as shown in FIG. 2A, then the duty ratio of the high-frequency pulse shown in FIG. 2B is appropriately set, and then deposition is performed at a condition where the radical amount of $SiH_3$ and the ion amount of $SiH_3^+$ are maximized. Plasma formation using the high-frequency pulse shown in FIG. 2B allows the $SiH_3^+$ ion and the $SiH_3$ radical to alternately reach to the Si wafer 1 during the on-state and the off-state of the high-frequency pulse.

As shown in FIG. 3B, when the high-frequency pulse is in the on-state and the $SiH_3^+$ ion is predominant, a $SiH_3^+$ ion 2si impinging in a vertical direction to the Si substrate 1 reaches to the bottom of the trench 1t, and separates hydrogen (H) terminating a bottom surface of the trench 1t. Thus, an adsorption site 1q is formed on the bottom surface of the trench 1t.

As shown in FIG. 2A, bias voltage Vb is preferably applied to the Si wafer 1 during operation of the plasma CVD. Thus, the $SiH_3^+$ ion 2si is accelerated to advance further straightly, consequently allowed to preferentially reach to the bottom of the trench 1t. The $SiH_3^+$ ion 2si that has reached to the bottom of the trench 1t separates H terminating the surface as described before, and the adsorption site 1q is preferentially formed on the bottom surface of the trench 1t.

Next, as shown in FIG. 3C, when the high-frequency pulse is in the off-state and the $SiH_3$ radical is predominant, the $SiH_3$ radical 2sr entering into the trench 1t is absorbed by the adsorption site 1q preferentially formed on the bottom surface of the trench 1t. Thus, the epitaxial layer 1e is selectively grown from the bottom of the trench 1t. Since Si on an upper surface of the trench 1t is terminated by H, growth of the epitaxial layer 1e is inhibited in an upper part of the trench 1t.

Processes shown in FIGS. 3B and 3C are alternately repeated in synchronization with the on and off cycle of the high-frequency pulse shown in FIG. 2B, thereby the epitaxial layer 1e can be grown from the bottom of the trench 1t stably and continuously, which allows filling of the trench 1t. Thus, the trench 1t by the epitaxial layer 1e can be filled without formation of the void shown in FIG. 1C.

Substrate temperature of 900 to 1200° C. is necessary for growing the epitaxial layer 1e by the LP-CVD. On the other hand, by using the plasma CVD, epitaxial growth can be made at low temperature (for example, room temperature to 300° C.). However, even in the plasma CVD, higher substrate temperature is preferable to improve crystallinity of the epitaxial layer 1e. Moreover, the Si substrate (wafer) 1 after trench-filling by the plasma CVD may be subjected to heat treatment in hydrogen atmosphere, nitrogen atmosphere, or the like. This can also improve crystallinity of the epitaxial layer 1e grown in the trench 1t.

In the plasma CVD shown in FIG. 2A, not only the Si source gas 3, but also a halide gas may be supplied into the chamber.

Figure 4A:
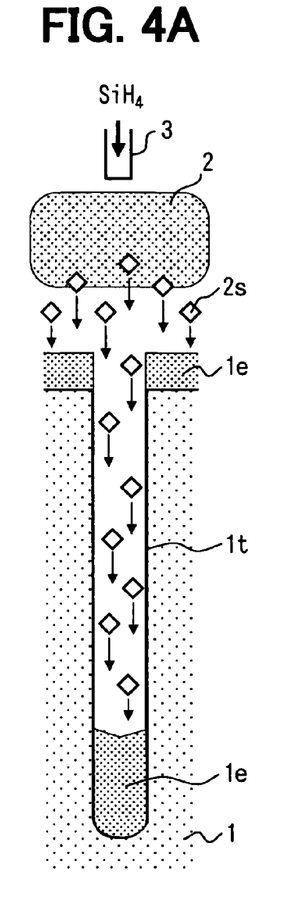
FIG. 4A is a cross sectional view showing the plasma CVD method without a halide gas.
Figure 4B:
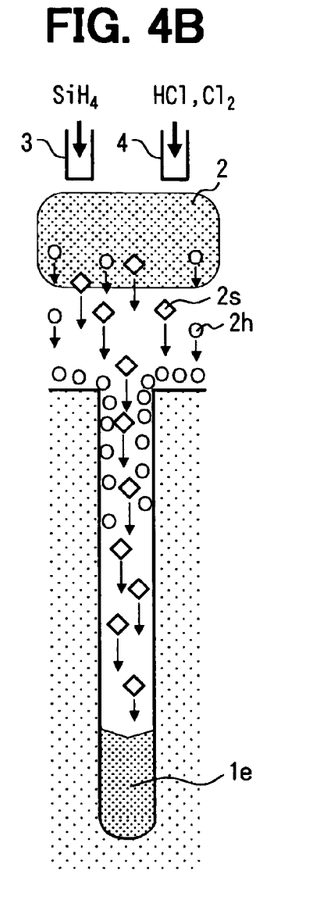
FIG. 4B is a cross sectional view showing the plasma CVD method with supplying the halide gas at the same time.
Figure 4C:
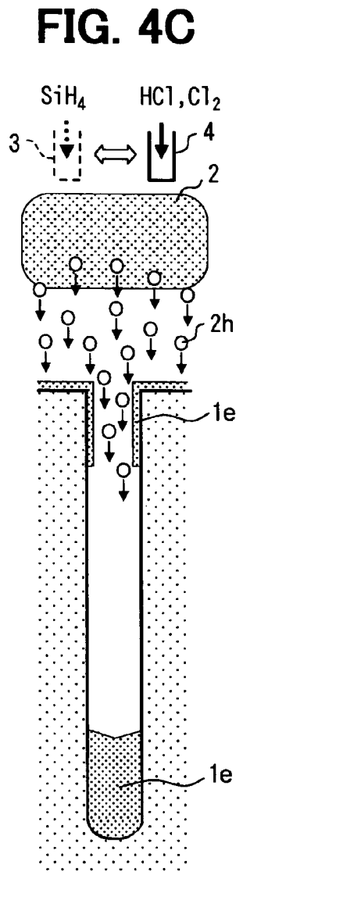
FIG. 4C is a cross sectional view showing the plasma CVD method with supplying the halide gas alternately.

FIGS. 4A to 4C are views for illustrating an effect of supplying a halide gas 4, wherein FIG. 4A shows a case that the halide gas 4 is not supplied, FIG. 4B shows a case that the halide gas 4 and the Si source gas 3 are supplied at the same time, and FIG. 4C shows a case that the halide gas 4 and the Si source gas 3 are alternately supplied. As the halide gas 4, for example, as shown in the figures, either of inexpensive hydrochloric (HCl) gas or chlorine ($Cl_2$) gas can be used.

As shown in FIG. 4A, when the halide gas 4 is not supplied, the epitaxial layer 1e is formed not only in the trench 1t but also on a surface of the Si substrate 1 by the Si source 2s formed by the plasma 2. Therefore, in the case that the halide gas 4 is not supplied as in FIG. 4A, surface polishing of the Si substrate 1 is necessary after filling of the trench 1t.

As shown in FIG. 4B, when the halide gas 4 and the Si source gas 3 are supplied at the same time, the halide gas, particularly Cl atoms are terminating the surface of silicon on the periphery of the top of the trench 1t, and cover the periphery of the top. In this way, the halide gas 4 and the Si source gas 3 are supplied at the same time, thereby growth of epitaxial layer 1e can be inhibited in the periphery of the top of the trench 1t.

As shown in FIG. 4C, when the halide gas 4 and the Si source gas 3 are alternately supplied, a deposition process by the Si source and etching of the periphery of the top of the trench 1t by a halide gas 2h can be alternately performed. In this way, an etching process for the periphery of the top of the trench 1t is introduced, thereby the epitaxial layer 1e growing in the periphery of the top of the trench 1t is appropriately removed, and consequently filling performance of the trench 1t can be improved.

As shown in FIGS. 8A to 8B, in filling of the trench 1t using the LP-CVD, when the aspect ratio (depth d/width w) of the trench 1t is 30 or more, the inferior crystal tends to be formed at the void 1v. On the contrary, in a manufacturing method using the plasma CVD, even in the trench 1t having the large aspect ratio, the epitaxial layer can be grown from the bottom of the trench 1t, and consequently formation of the void can be prevented. Therefore, the manufacturing method using the plasma CVD is preferable for filling of the trench 1t having an aspect ratio of 30 or more in which the epitaxial layer 1e is hard to be grown excellently in the LP-CVD.

Figure 5A:
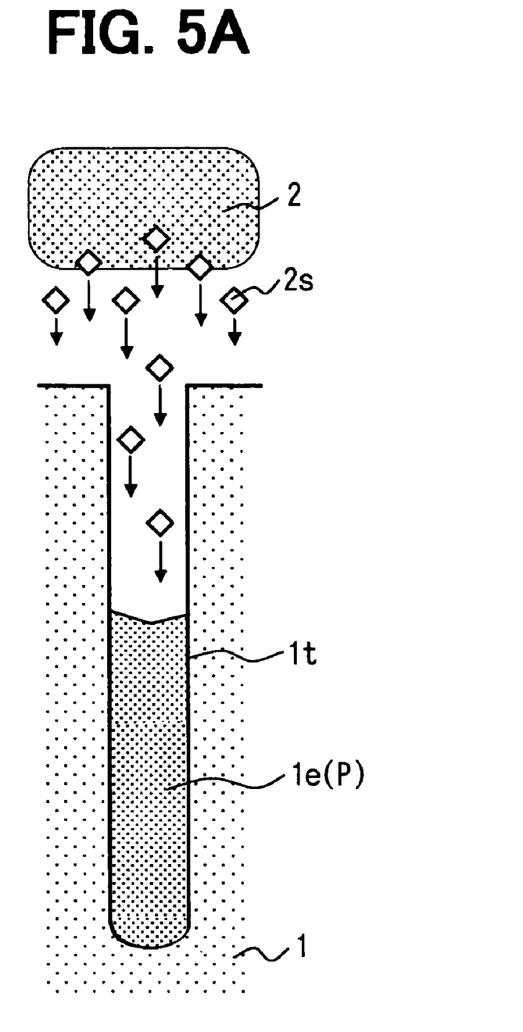
FIGS. 5A and 5B are cross sectional views explaining a combination method of the plasma CVD method and a LP-CVD method.
Figure 5B:
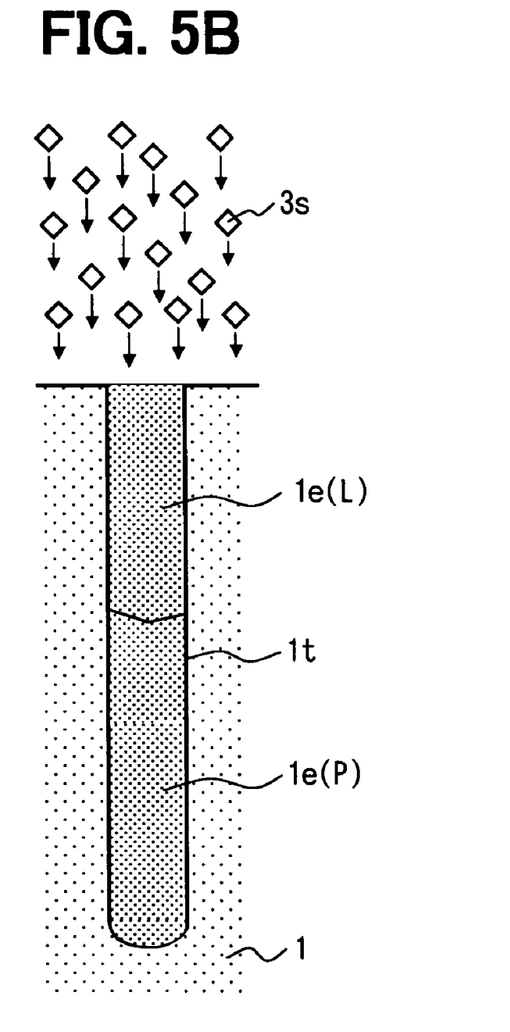

On the other hand, as shown in FIGS. 5A to 5B, the plasma CVD and the LP-CVD can be used in a combined manner. FIG. 5A shows first filling of the trench 1t using the plasma CVD, and FIG. 5B shows second filling of the trench 1t using the LP-CVD.

First, as shown in FIG. 5A, using the plasma CVD, the Si source 2s such as $SiH_3$ radical formed by the plasma 2 is supplied into the trench 1t, so that an epitaxial layer 1e (P) is grown to fill the trench 1t halfway. Next, as shown in FIG. 5B, using the LP-CVD, the Si source 3s by the Si source gas is decomposed on the Si substrate 1 heated to high temperature of 900° C. or more. Thus, a second epitaxial layer 1e (L) including silicon (Si) is grown in the trench 1t to completely fill the trench 1t.

In a method in a combination of the plasma CVD and the LP-CVD as shown in FIGS. 5A and 5B, in the first plasma CVD of FIG. 5A, the epitaxial layer 1e (P) is grown on the bottom of the trench 1t and thus the trench 1t is filled to a level where the void is not formed even if the LP-CVD is used, so that the aspect ratio of the trench 1t is decreased. Next, using the LP-CVD having the large deposition rate as shown in FIG. 5B, the epitaxial layer 1e (L) is grown to completely fill the trench 1t. Thus, epitaxial growth by the plasma CVD that enables low-temperature growth, but has small growth rate is compensated, and consequently throughput of trench-filling can be improved as a whole. The plasma CVD and the LP-CVD may be treated in separate chambers respectively, or may be treated in the same chamber.

The filling of the trench 1t by growth of the epitaxial layer 1e using the plasma CVD has small dependence on a plane direction of the semiconductor substrate 1 or a plane direction of a side of the trench 1t. Therefore, semiconductor substrates and trenches in various plane directions shown in FIGS. 6A to 6C can be used.

Figure 6A:
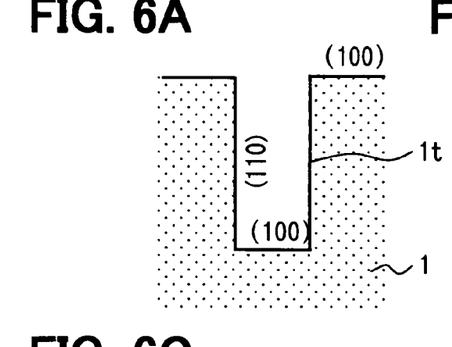
FIGS. 6A to 6C are cross sectional views showing a substrate having a different surface orientation.
Figure 6B:
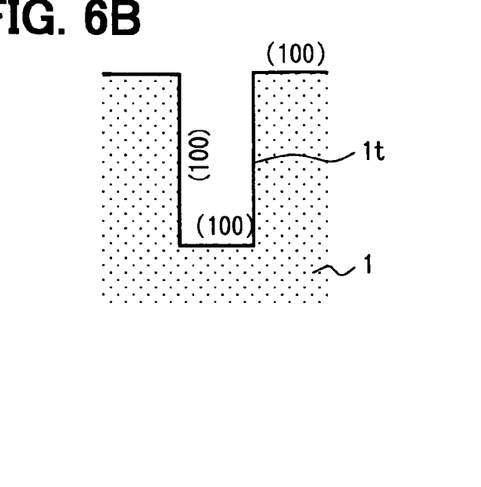

FIGS. 6A to 6B show a case that, as the semiconductor substrate 1, a Si (100) substrate is used, which provides most excellent characteristics when it is formed into a device. For example, in the case that a MOS transistor is formed in a surface portion of the Si substrate 1, when a channel of the MOS transistor is formed in a (100) plane using the Si (100) substrate, excellent characteristics are obtained in mobility and interface state compared with a case of using a Si substrate in another plane direction. Compared with the Si (100) substrate, in FIG. 6A, sides of the trench 1t are configured in (110) planes. In FIG. 6B, the sides of the trench 1t are configured in (100) planes. In this case, all the sides and the bottom of the trench 1t are in the (100) plane. Both of the trenches 1t in FIGS. 6A to 6B are formed using dry etching.

The filling of the trench 1t by growth of the epitaxial layer 1e using the plasma CVD can be performed to any of the Si substrates 1 and the trenches it in FIGS. 6A to 6B.

Figure 6C:
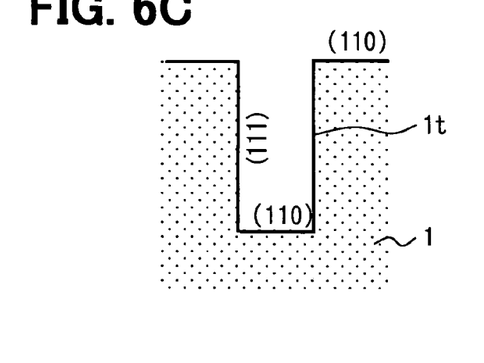

In FIG. 6C, a Si (110) substrate is used as the semiconductor substrates 1, and sides of the trench 1t are configured in (111) planes. The configuration of these planes is that most excellent in filling performance in filling using the LP-CVD, and is preferable for a case of using the plasma CVD and the LP-CVD in a combined manner as shown in FIGS. 5A to 5B. Moreover, in the plane-direction configuration, wet etching using TMAH, KOH or the like can be used for formation of the trench 1t.

As shown hereinbefore, the manufacturing method of the semiconductor device is provided, the device being manufactured in a way that the trench 1t is formed in the semiconductor substrate 1, and then the relevant trench 1t is filled; wherein a trench can be filled without formation of the void even if the trench 1t has a large aspect ratio. Accordingly, the method is preferable for manufacturing the semiconductor device 100 having the PN column layer 1a shown in FIG. 7, which has low on-resistance and high breakdown voltage.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising steps of:
   forming a trench on a semiconductor substrate, the trench being made of silicon and having an aspect ratio equal to or larger than 30; and
   filling the trench with an epitaxial layer, wherein
   the epitaxial layer is made of silicon,
   the step of filling the trench includes a step of performing a plasma CVD method with using a silicon source gas,
   wherein in the step of performing the plasma CVD method, a $SiH_3$ radical, a $SiH_2$ radical, a SiH radical and a Si radical are generated in a plasma, and
   wherein an amount of the $SiH_3$ radical is controlled to be maximum.

2. The method according to claim 1, wherein
   the silicon source gas is made of $SiH_4$.

3. The method according to claim 1, wherein
   in the step of performing the plasma CVD method, the silicon source gas is supplied to the semiconductor substrate from above the semiconductor substrate.

4. The method according to claim 1, wherein
   in the step of performing the plasma CVD method, multiple types of ions including a $SiH_3^+$ ion are generated in a plasma, and
   an amount of the $SiH_3^+$ ion is controlled to be maximum.

5. The method according to claim 1, wherein
   in the step of performing the plasma CVD method, a plasma is formed by using a high frequency pulse, and
   in the step of performing the plasma CVD, a duty ratio of the high frequency pulse is controlled so that the amount of the $SiH_3$ radical or an amount of $SiH_3$ ion is maximized.

6. The method according to claim 1, wherein
   in the step of performing the plasma CVD method, a $SiH_3$ radical, a $SiH_2$ radical, a SiH radical, a Si radical and multiple types of ions are generated in a plasma, and
   each amount of the $SiH_3$ radical, the $SiH_2$ radical, the SiH radical, the Si radical and the multiple types of ions is monitored.

7. The method according to claim 1, wherein
   in the step of performing the plasma CVD method, a bias voltage is applied to the semiconductor substrate.

8. The method according to claim 1, further comprising a step of:
   processing a surface of the trench by using hydrofluoric acid before the step of filling the trench so that an inner wall of the trench is terminated with hydrogen.

9. The method according to claim 1, wherein
   in the step of performing the plasma CVD method, the plasma CVD method is performed in such a manner that a halide gas together with the silicon source gas is supplied to the semiconductor substrate.

10. The method according to claim 1, wherein
    in the step of performing the plasma CVD method, the plasma CVD method is performed in such a manner that a halide gas and the silicon source gas are alternately supplied to the semiconductor substrate.

11. The method according to claim 10, wherein the halide gas is a HCl gas or a Cl$_2$ gas.

12. The method according to claim 1, wherein in the step of performing the plasma CVD method, a temperature of the semiconductor substrate is in a range between a room temperature and 900° C.

13. The method according to claim 1, further comprising a step of:
heating the semiconductor substrate after the step of filling the trench.

14. The method according to claim 13, wherein the step of heating the semiconductor substrate is performed under a hydrogen gas atmosphere or a nitrogen gas atmosphere.

15. The method according to claim 1, wherein the step of filling the trench further includes a step of performing a LP-CVD method with using the silicon source gas,
in the step of performing the plasma CVD method, the plasma CVD method is performed until the trench is partially filled with a first epitaxial layer,
in the step of performing the LP-CVD method, the LP-CVD method is performed after the step of performing the plasma CVD method so that a remaining trench is filled with a second epitaxial layer, and
the first and second epitaxial layers provide the epitaxial layer in the trench.

16. The method according to claim 1, wherein the semiconductor substrate includes a surface having a (100)-surface orientation.

17. The method according to claim 1, wherein the trench includes a sidewall having a (100)-surface orientation.

18. The method according to claim 1, wherein the trench includes a sidewall having a (110)-surface orientation.

19. The method according to claim 1, wherein the semiconductor substrate includes a surface having a (110)-surface orientation.

20. The method according to claim 19, wherein the trench includes a sidewall having a (111)-surface orientation.

21. The method according to claim 1, wherein
the semiconductor device includes a PN column layer,
the semiconductor substrate has a first conductive type,
the epitaxial layer has a second conductive type,
the semiconductor substrate and the epitaxial layer provide the PN column layer, and
in the step of performing the plasma CVD method, the plasma CVD method is performed in such a manner that an impurity gas having the second conductive type together with the silicon source gas is supplied to the semiconductor substrate.

* * * * *